United States Patent

[11] 3,573,675

[72] Inventor Thomas C. Leonard
Topsfield, Mass.

[21] Appl. No. 849,716
[22] Filed Aug. 13, 1969
[45] Patented Apr. 6, 1971
[73] Assignee Varian Associates
Palo Alto, Calif.

[54] HIGH FREQUENCY BAND-PASS FILTER
5 Claims, 3 Drawing Figs.

[52] U.S. Cl. .......... 333/73, 333/97, 317/261
[51] Int. Cl. .......... H03h 7/10, H01p 1/00
[50] Field of Search .......... 333/73, 73 (C), 73 (S), 73 (W), 97, 70; 317/261

[56] References Cited

UNITED STATES PATENTS

| | | | |
|---|---|---|---|
| 3,142,808 | 7/1964 | Gonda .......... | 333/73 |
| 3,268,838 | 8/1966 | Matthaei .......... | 333/73 |
| 3,302,080 | 1/1967 | Dauger et al. .......... | 317/261X |
| 3,491,275 | 1/1970 | Puppolo et al. .......... | 317/261X |

*Primary Examiner*—Eli Lieberman
*Assistant Examiner*—T. Vezeau
*Attorneys*—Stanley Z. Cole and Gerald L. Moore

ABSTRACT: A high frequency band-pass filter is disclosed. The filter includes an input resonator and an output resonator decoupled by means of a capacitor common to both resonators. A pair of capacitors are provided for impedance transforming into and out of the resonators, respectively. The aforementioned capacitors and the two resonator capacitors are formed by a stack of insulatively immediately overlaying conductive plates stacked over a ground plane. The conductive plates have mutually opposed areas which decrease in the ascending direction of the stack. The two inductors of the tuned circuits are formed by a pair of short sections of transverse electromagnetic transmission line connected between a pair of plates in the stack and the ground plane.

INVENTOR.
THOMAS C. LEONARD
BY Gerald L Moore
ATTORNEY

HIGH FREQUENCY BAND-PASS FILTER

DESCRIPTION OF THE PRIOR ART

Heretofore, band-pass filters for high frequency circuits, i.e., S-band to C-band, have been designed from an impedance basis using the specific design values of inductance and capacitance derived from a Butterworth or Chebishev filter solution for maximally flat amplitude response. Filters of this type at these frequencies employ inductors formed by sections of coaxial line sufficiently long to provide substantial distributed inductance, whereas the capacitor values are quite small. Such filters are difficult to fabricate at these high frequencies and are prone to radiation of energy due to relatively high characteristic impedances employed therein.

SUMMARY OF THE PRESENT INVENTION

The principal object of the present invention is the provision of an improved high frequency band-pass filter.

One feature of the present invention is the provision of a stack of conductive structures to form all the capacitors of the filter, such conductive structures being insulated from each other and from a ground plane structure on which they are stacked, whereby fabrication of the capacitive elements of the filter is facilitated.

Another feature of the present invention is the same as the preceding feature wherein the mutually opposed area of the stacked conductive structures decreases in ascending order through the stack, whereby two capacitors of two resonators of the filter are formed on a common plate of a decoupling capacitor.

Another feature of the present invention is the same as any one or more of the preceding features wherein a pair of essentially lumped element inductors are connected between conductive structures in the stack and ground to define with capacitors in the stack two resonant circuits of the filter.

Other features and advantages of the present invention will become apparent upon a perusal of the following specification taken in connection with the accompanying drawings wherein:

DESCRIPTION OF THE PREFERRED EMBODIMENTS

Figure 1:
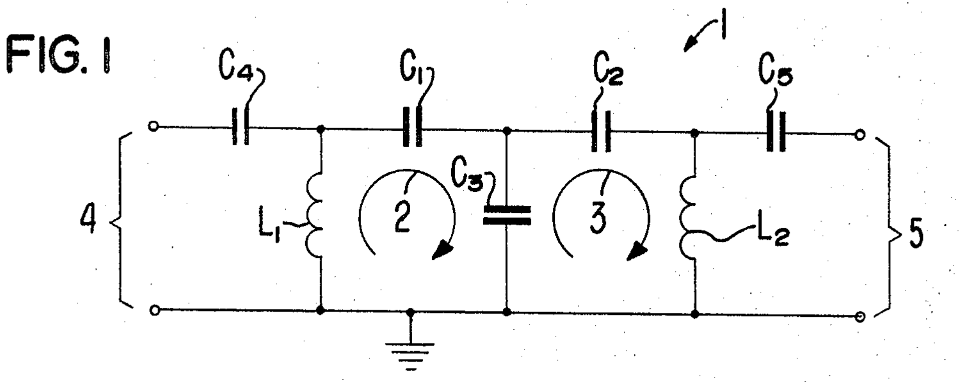
FIG. 1 is a schematic equivalent circuit diagram of a band-pass filter of the present invention.

Referring now to FIG. 1, there is shown a schematic lumped element equivalent circuit for the band-pass filter of the present invention. The filter 1 includes an input resonator formed by inductor $L_1$ and capacitor $C_1$ tuned for a resonant frequency within the passband of the filter 1 and connected together via the intermediary of a large bypass capacitor $C_3$ and ground to form a first closed resonator loop, indicated by arrow 2, An output resonator is formed by inductor $L_2$ and capacitor $C_2$ tuned for a resonant frequency within the passband of the filter 1 and connected together via the intermediary of the large bypass capacitor $C_3$ and ground to form a second closed resonator loop, indicated by arrow 3.

An input capacitor $C_4$ is connected to the input resonator 2 for matching the impedance of an input device or transmission line, not shown, to the input resonator 2. The input device or transmission line is connected at input terminals 4. An output capacitor $C_5$ is connected to the output resonator 3 for matching the impedance of the output resonator 3 to an output transmission line, not shown, connected at output terminals 5.

The specific values of the elements $L_1$, $C_1$, $L_2$, $C_2$ and $C_3$ are found by reference to any one of a number of texts on band-pass filter design taking into consideration the desired characteristic of the filter 1, such as operating frequency, width of the passband, amplitude response, phase shift, etc. The solutions to be employed are those derived on the basis of admittance, as opposed to those solutions based upon consideration of circuit impedances. Typical solutions for a maximally flat amplitude and phase response based on admittance are to be found in a text titled, "Microwave filters, Impedance Matching Networks, and Coupling Structures" by Matthaei, Young & Jones, published by McGraw Hill Book Company in 1964 at pages 83—162. Such solutions are characterized by $L_1$ and $L_2$ having relatively small values of inductance, whereas $C_1$ and $C_2$ will have relatively large values of capacitance for circuits at relatively high operating frequencies. The capacitance of $C_3$ will be large compared to the capacitances of $C_1$ and $C_2$. $C_4$ and $C_5$ will normally have values of capacitance small compared to the capacitances of $C_1$ and $C_2$.

Figure 2:
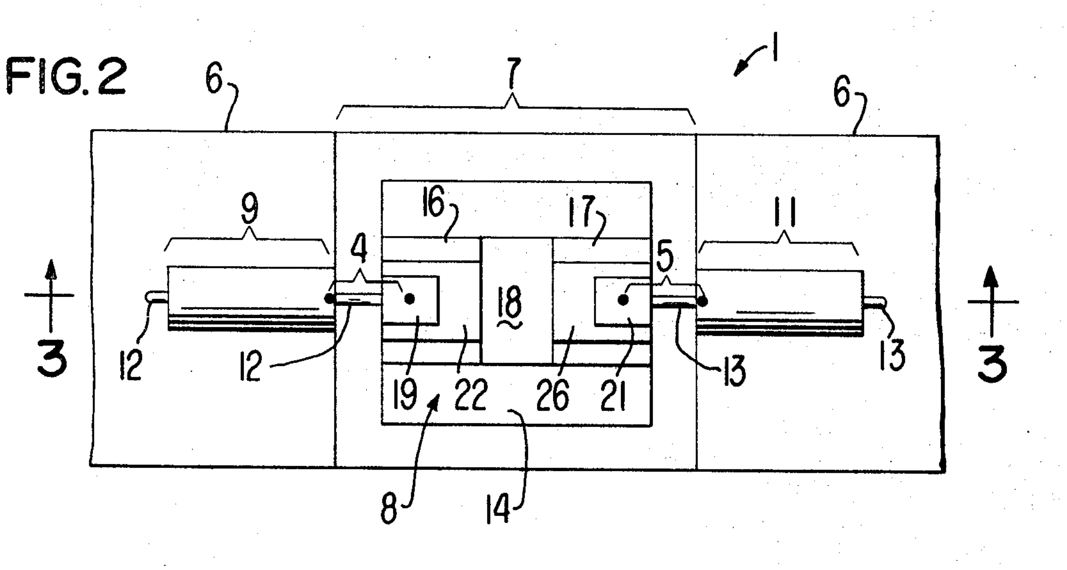
FIG. 2 is a plan view of the physical realization of the circuit of FIG. 1.
Figure 3:
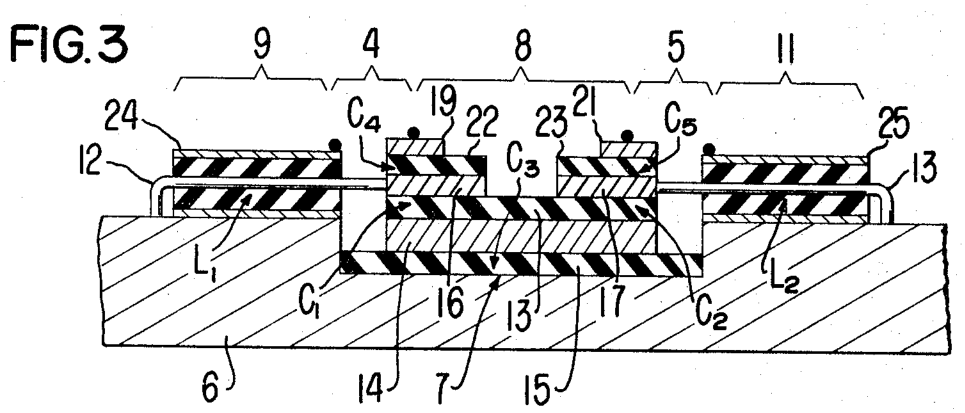
FIG. 3 is a sectional view of the structure of FIG. 2 taken along line 3–3 in the direction of the arrows.

Referring now to FIGS. 2 and 3, there is shown a physical realization of the circuit of FIG. 1 for operation at relatively high frequencies, such as L-band and up to C-band. Briefly, the filter circuit 1 includes a ground plane structure 6, such as slab of copper or brass. The slab 6 is centrally recessed at 7. All the capacitors $C_1$, $C_2$, $C_3$ $C_4$, and $C_5$ are stacked in a stack 8 over ground plane 6 in the recessed portion 7. Inductors $L_1$ and $L_2$ are formed by short lengths of transverse electromagnetic transmission line such as coaxial lines 9 and 11, respectively, with their center conductors 12 and 13, respectively each interconnecting a respective capacitor structure in the stack 8 and the ground plane 6, as more fully described below.

The stack of capacitors 8 includes a first conductive plate 14, as of copper, insulatively disposed immediately overlaying the recessed portion 7 of the ground plane structure 6 via the intermediary of a sheet of dielectric insulative material 15, as of Teflon, to form the decoupling capacitor $C_3$.

Second and third conductive plates 16 and 17 are insulatively disposed immediately overlaying separate portions of the first conductive member 14 via the intermediary of a second sheet of dielectric insulative material 13 to form the resonator capacitors $C_1$ and $C_2$, respectively. Capacitor plates 16 and 17 each have a smaller capacitive area than capacitor $C_3$, in accordance with the aforecited requirements for the values of the capacitors of the filter.

Fourth and fifth conductive plates 19 and 21 are insulatively disposed immediately overlaying conductive plates 16 and 17, respectively, via the intermediary of insulative dielectric sheets 22 and 23, respectively, to define input and output capacitors $C_4$ and $C_5$, respectively. Capacitor plates 19 and 21 each have a smaller capacitive area than immediately underlaying capacitors $C_1$ and $C_2$, in accordance with the aforecited requirements for the values of the input and output capacitors of the filter 1.

The inductors 9 and 11 are connected between plates 16 and 17, respectively, and the ground plane structure 6 via center conductors 12 and 13. The inductors 9 and 11 each comprise a relatively short length of coaxial line such that they appear essentially as lumped inductive elements of relatively small inductance. More particularly, such coaxial line sections are of sufficiently short length $\iota$ such that, at the center frequency of the passband of the filter, each inductor has a Tan $\beta l$ approximately equal to $\beta l$, where $\beta$ is the phase constant for the respective coaxial line section. The outer conductors 24 and 25 of the coaxial line sections are conductively connected directly to the ground plane structure 6. Moreover, the characteristic impedance of the coaxial line sections 9 and 11 is chosen to have a low value, as of 10 ohms, such that minimal values of inductance can be accurately controlled.

Input and output connections are made across terminals 4 and 5, respectively, located atop inductor 9 or at some other ground potential point and plate 19 and inductor 11 or at some other ground potential point and plate 21, respectively.

The advantages of the filter 1 of FIGS. 2 and 3 are that all the capacitors are conveniently stacked in stack 7 to facilitate fabrication, low impedances exist throughout the resultant filter network such that radiation of high frequency energy from the circuit is minimized, and the aforedescribed design, based on admittance considerations, is more practical at higher frequencies than prior designs based on impedance considerations.

Since many changes could be made in the above construction and many apparently widely different embodiments of this invention could be made without departing from the scope thereof, it is intended that all matter contained in the above description or shown in the accompanying drawings shall be interpreted as illustrative and not in a limiting sense.

I claim:

1. In a high frequency band-pass filter circuit, means forming an input resonator circuit loop tuned for a resonant frequency within the passband of the filter and having a first inductor and a first capacitor, means forming an output resonator circuit loop tuned for a resonant frequency within the passband of the filter circuit and having a second inductor and a second capacitor, means forming a third capacitor common to both of said input and output resonant circuit loops for decoupling same, means forming fourth and fifth capacitors for coupling into and out of said input and output resonators, respectively, the improvement wherein, all of said five capacitors are formed by a stack of first, second, third, fourth and fifth conductive structures insulatively stacked with respect to each other and with respect to a sixth ground plane structure, said five structures insulatively stacked with respect to each other and with respect to a sixth ground plane structure, said five structures being stacked with said first structure insulatively disposed immediately overlaying said sixth ground plane structure to define said third capacitor therebetween, said second and third conductive structures each of smaller capacitive area than said first structure being disposed insulatively immediately overlaying said first structure to define said first and second capacitors, respectively, and said fourth and fifth structures each of smaller capacitive area than said second and third structures being insulatively disposed immediately overlaying said second and third structures, respectively, to define said fourth and fifth capacitors, respectively.

2. The apparatus of claim 1, wherein said first and second inductors are connected between said second and third conductive structures, respectively, and said sixth ground plane structure.

3. The apparatus of claim 1 wherein said first, second, third, fourth, and fifth conductive structures are conductive plates.

4. The apparatus of claim 3 including sheets of insulative material sandwiched in between adjacent ones of said first, second, third, fourth, fifth and sixth conductive structures for insulatively supporting said stacked structures.

5. The apparatus of claim 2 wherein said first and second inductors each comprise a relatively short length of coaxial line such that at the center frequency of the passband of the filter said short lengths of coaxial line have a Tan $\beta l$ approximately equal to $\beta l$, where $\beta$ is the phase constant for the respective coaxial line and $l$ is the length of the respective coaxial line.